US009106236B2

(12) United States Patent
 Mai

(10) Patent No.: US 9,106,236 B2
(45) Date of Patent: Aug. 11, 2015

(54) SPREAD-SPECTRUM PHASE LOCKED LOOP CIRCUIT AND METHOD

(71) Applicant: CAPITAL MICROELECTRONICS CO., LTD., Beijing (CN)

(72) Inventor: Rifeng Mai, Beijing (CN)

(73) Assignee: CAPITAL MICROELECTRONICS CO., LTD., Beijing (CN)

( * ) Notice: Subject to any disclaimer, the term of this patent is extended or adjusted under 35 U.S.C. 154(b) by 0 days.

(21) Appl. No.: 14/080,987

(22) Filed: Nov. 15, 2013

(65) Prior Publication Data

US 2015/0061736 A1    Mar. 5, 2015

(30) Foreign Application Priority Data

Aug. 28, 2013  (CN) .......................... 2013 1 0381769

(51) Int. Cl.
 *H03L 7/06* (2006.01)
 *H03L 7/08* (2006.01)
(52) U.S. Cl.
 CPC .................................... *H03L 7/0802* (2013.01)
(58) Field of Classification Search
 USPC .................................................. 327/147, 156
 See application file for complete search history.

(56) References Cited

U.S. PATENT DOCUMENTS

| | | | |
|---|---|---|---|
| 6,294,936 B1 * | 9/2001 | Clementi ....................... 327/156 |
| 6,549,078 B1 * | 4/2003 | Sridharan et al. ............... 331/17 |
| 8,284,816 B1 * | 10/2012 | Clementi ....................... 375/130 |
| 2005/0122145 A1 * | 6/2005 | Ido et al. ........................ 327/156 |
| 2005/0285641 A1 * | 12/2005 | Miyata et al. ................. 327/156 |
| 2006/0267647 A1 * | 11/2006 | Chang ........................... 327/156 |
| 2010/0117881 A1 * | 5/2010 | Baker ............................ 341/143 |
| 2010/0214031 A1 * | 8/2010 | Yamamoto et al. ............ 331/34 |
| 2011/0006938 A1 * | 1/2011 | Ihs et al. ....................... 341/143 |
| 2011/0016344 A1 * | 1/2011 | Melanson et al. ............. 713/501 |
| 2011/0026083 A1 * | 2/2011 | Nakazawa .................... 358/401 |
| 2011/0062884 A1 * | 3/2011 | Jang et al. ..................... 315/291 |
| 2011/0156606 A1 * | 6/2011 | Hwang et al. ................. 315/186 |
| 2012/0068867 A1 * | 3/2012 | Pagnanelli .................... 341/120 |
| 2012/0212361 A1 * | 8/2012 | Lai et al. ....................... 341/143 |
| 2012/0235717 A1 * | 9/2012 | Hirai et al. .................... 327/156 |
| 2013/0141264 A1 * | 6/2013 | Wan et al. ..................... 341/143 |
| 2013/0160544 A1 * | 6/2013 | Hsu et al. ................... 73/504.12 |
| 2013/0162857 A1 * | 6/2013 | Kwon et al. ................. 348/222.1 |
| 2013/0257497 A1 * | 10/2013 | Thelen et al. ................ 327/158 |
| 2015/0061736 A1 * | 3/2015 | Mai .............................. 327/156 |

\* cited by examiner

*Primary Examiner* — Adam Houston
(74) *Attorney, Agent, or Firm* — Buchanan Ingersoll & Rooney PC

(57) ABSTRACT

A phase locked loop (PLL) circuit and a method thereof are provided. In an embodiment, the PLL circuit includes: a switched capacitor circuit, in which the switched capacitor circuit generates a modulation waveform, and the modulation waveform is injected into the PLL circuit in a current form, so that a PLL output frequency is modulated. Compared with the spread spectrum phase locked loop (SS-PLL) in the prior art, the SS-PLL in embodiments of the present invention is simple in structure, low in power consumption, low in silicon overhead, and flexible both in spreading factor and modulation frequency.

7 Claims, 4 Drawing Sheets

SPREAD-SPECTRUM PHASE LOCKED LOOP CIRCUIT AND METHOD

BACKGROUND

1. Technical Field

The present invention relates to a phase locked loop (PLL) circuit, and in particular, to a spread-spectrum PLL circuit.

2. Related Art

In recent years, as the speed of the SoC (System on Chip) has been increased, problematic electromagnetic interference has become increasingly serious in large-scale integrated circuits and digital household electrical appliances. The spread spectrum control PLL (SS-PLL) is an effective means of reducing electromagnetic interference, which, by performing fine tuning on the frequency of a reference clock signal in an integrated circuit, spreads the spectrum of an output clock signal to reduce electromagnetic interference.

FIG. 1 is a block diagram of a prior art SS-PLL. The SS-PLL, in addition to including a phase-frequency detector (PFD), a first charge pump (CP), a low pass filter (LPF) and a voltage controlled oscillator (VCO), further includes a second CP. The operating frequency of the second CP is lower than that of the first CP. The charge and discharge currents of the second CP are superimposed onto those from the first CP through the LPF, so as to modulate a voltage applied to an input end of the VCO, thereby modulating the frequency of an output clock signal. However, the scheme requires the LPF to satisfy R1*C1=R2*C2. More importantly, as one of input signals of the PFD also contains a component of a modulated signal, the bandwidth of the PLL in the non-spread spectrum mode must be small enough to filter out such a feedback component generated by the modulated signal.

FIG. 2 is a block diagram of another prior art SS-PLL. The SS-PLL modulates a frequency divider therein. Although the scheme has achieved a good effect, the structure is complex.

SUMMARY

Embodiments of the present invention provide a PLL circuit in a first aspect. The PLL circuit includes: a switched capacitor circuit, in which the switched capacitor circuit generates a modulation waveform, and the modulation waveform is injected into the PLL circuit in a current form, so that a PLL output frequency is modulated.

Preferably, the PLL circuit includes a spread spectrum clock generator (SSCG), the switched capacitor circuit is located in the SSCG, the SSCG further has a first current source and a second current source, the SSCG periodically and alternately selects signals corresponding to the first current source and the second current source respectively with a frequency lower than a feedback clock signal, the switched capacitor circuit performs low pass filtering on the selected signals, and the low-pass-filtered signals have modulation waveforms.

Preferably, the PLL circuit includes a SSCG, the switched capacitor circuit is located in the SSCG, the SSCG further has a first current source, a second current source and an amplifier, and the second current source, the amplifier and a third capacitor are connected to form an integrator; the SSCG periodically and alternately selects signals corresponding to the first current source and the second current source respectively with a frequency lower than a feedback clock signal, to be used as positive and negative input signals of the integrator; and an output signal of the integrator is of a modulation waveform.

Preferably, the SSCG includes a third current source, the SSCG compares the modulation waveform with a current of the third current source to obtain a difference signal, and a loop filter circuit modulates the difference signal to a control voltage. Further preferably, the SSCG includes a transistor having a gate for receiving the low-pass-filtered signals, and a drain for receiving the current of the third current source.

Preferably, the modulation waveform is a triangular wave.

Preferably, the SS-PLL circuit includes: a charge pump circuit for switching release and inhalation of charge and discharge currents according to a phase difference between a feedback clock signal of an output clock signal of the PLL circuit and a reference clock signal; a loop filter circuit, having a filter capacitor, in which the filter capacitor is charged and discharged by the charge and discharge currents and generates a control voltage; and a voltage controlled oscillator for oscillating with a frequency corresponding to the control voltage.

The embodiments of the present invention provide a spectrum spreading method of a PLL circuit in a second aspect, the method including:

generating a modulation waveform by a switched capacitor circuit;

injecting the modulation waveform into the PLL circuit in a current form, so that a PLL output frequency is modulated.

Compared with the SS-PLL in the prior art, the SS-PLL in the embodiments of the present invention is simple in structure, low in power consumption, low in silicon overhead, and flexible both in spreading factor and modulation frequency.

BRIEF DESCRIPTION OF THE DRAWINGS

The technical solution of the present invention is further described below in detail with reference to the accompanying drawings and embodiments.

DETAILED DESCRIPTION

An embodiment of the present invention provides an SS-PLL circuit architecture based on a switched capacitor circuit. The switched capacitor circuit generates a modulation waveform, for example, a triangular wave, and the modulation waveform is injected into the PLL circuit in a current form, so that a PLL output frequency is modulated. Therefore, the spectrum of a PLL output clock is spread.

Figure 1:
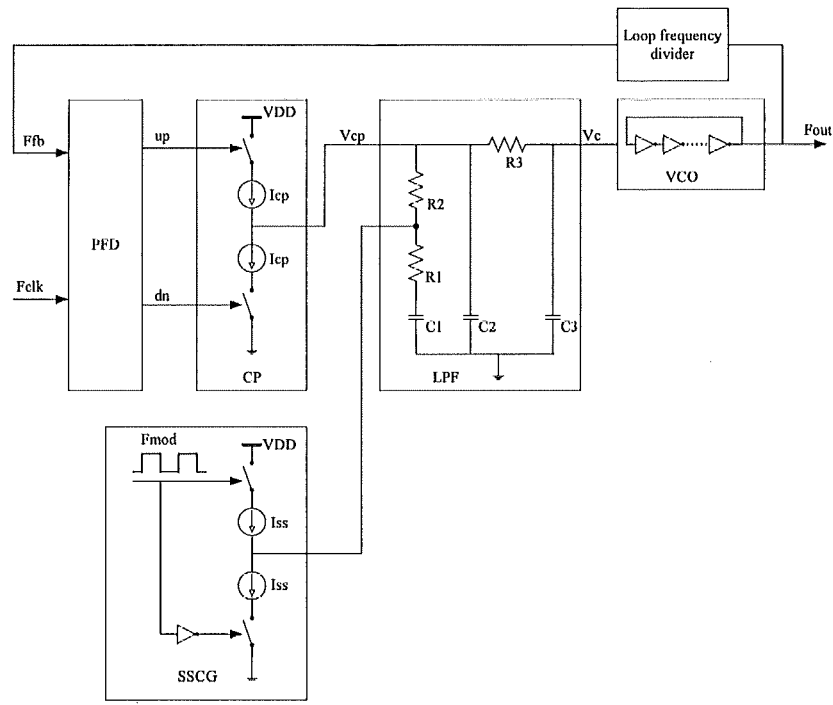
FIG. 1 is a block diagram of a prior art SS-PLL.
Figure 2:
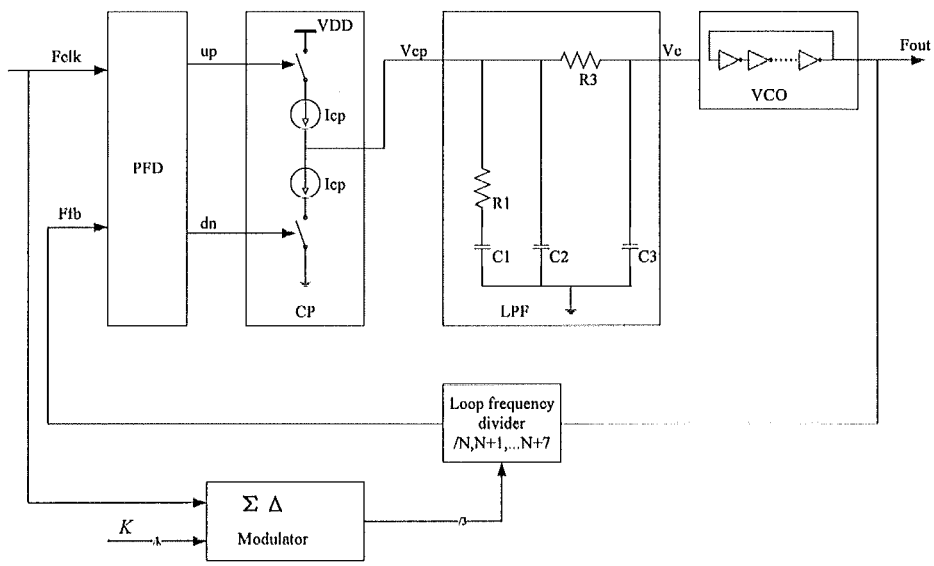
FIG. 2 is a block diagram of another prior art SS-PLL.
Figure 3:
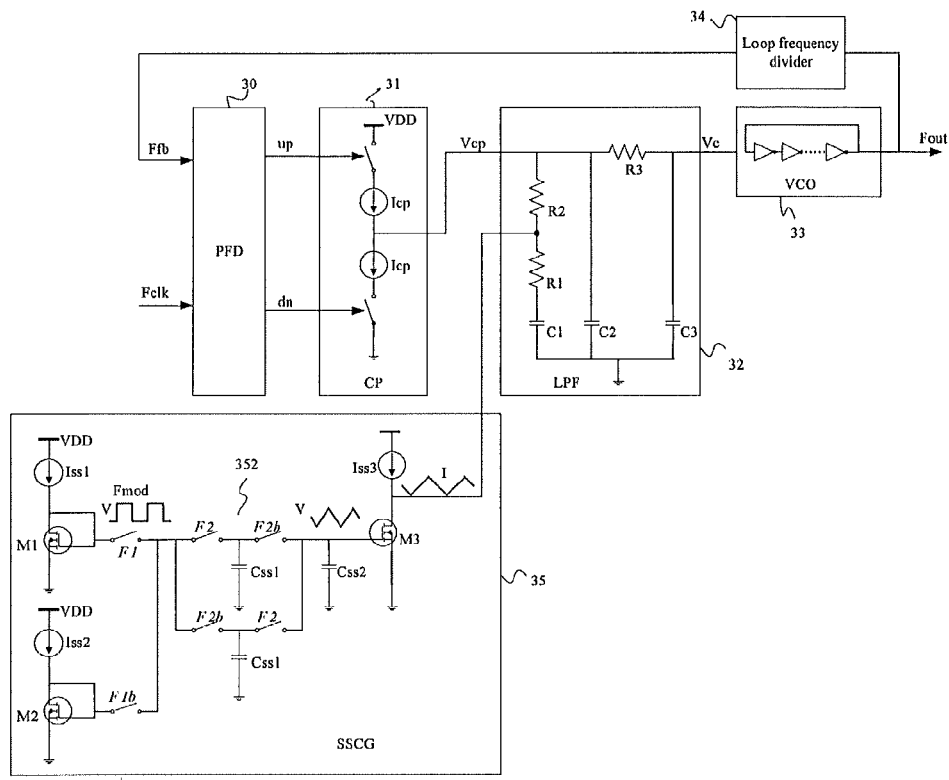
FIG. 3 illustrates an SS-PLL circuit according to an embodiment of the present invention.

FIG. 3 illustrates an SS-PLL circuit according to an embodiment of the present invention. As shown in FIG. 3, the PLL operates as a closed loop control system, and includes a PFD 30, a CP 31, a loop filter 32, a VCO 33, a loop frequency divider 34 and an SSCG 35. In an example, the PFD and the CP can be combined in a function block.

In the PFD 30, a reference frequency Fclk and a feedback frequency Ffb are compared. In many systems, such a PFD is a phase and frequency detector. The phase-frequency detector generates a signal up or dn corresponding to a phase difference between the reference frequency Fclk and the feedback frequency Ffb. In an example, the loop frequency divider 34 performs frequency division on an output clock signal Fout of the SS-PLL to generate a feedback clock signal Ffb.

The CP 31 switches release and inhalation of a charge current Icp according to an output of the PFD 30. When the signal up is active, the charge current is released; when the signal dn is active, the discharge current is inhaled.

The loop filter circuit (LPF) 32 smoothens the charge current to generate a voltage Vc. In the illustrated example, the loop filter circuit includes an LPF in a three-level RC structure, in which the first level includes a resistor R1, a resistor R2 and a capacitor C1; the second level includes a capacitor C2; the third level includes a resistor R3 and a capacitor C3. R3 and C3 can further eliminate the spike problem brought about by a reference clock. The LPF smoothens a current from a CP circuit 12. Certainly, persons skilled in the art will realize that LPFs in other forms also can be used, for example, an LPF in a two-level RC structure, as long as they do not depart from the scope of the present invention.

The loop filter circuit may further include a voltage division circuit consisting of R1 and R2, and the voltage division circuit superimposes a current from the SSCG 35 onto the current from the CP circuit 12.

The VCO 33 oscillates with a frequency corresponding to Vc, and outputs a clock signal with a frequency Fout.

The PFD 30, the CP circuit 31, the loop filter circuit 32 and the VCO 33 constitute a PLL in a non-spread spectrum mode, and persons skilled in the art can realize that the PLL may also be formed by circuits of other forms, as long as they do not depart from the scope of the present invention.

The SSCG has a switched capacitor circuit, a first current source Iss1 and a second current source Iss2. The SSCG periodically and alternately turns on and off switches φ1 and φ1b with a frequency Fmod lower than a feedback clock signal Ffb, so as to alternately select signals Iss1*$R_{M1}$ and Iss2*$R_{M2}$ respectively corresponding to the first current source Iss1 and the second current source Iss2 to flow into a switched capacitor circuit 352. $R_{M1}$ and $R_{M2}$ are resistances presented by transistors M1 and M2 respectively.

A switch in the switched capacitor circuit 352 operates with a frequency fc higher than that of a flowing-in voltage signal, and the switched capacitor circuit is equivalent to a resistor with a resistance of 1/(fc*Css1), in which Css1 is the capacitance of a switched capacitor. The resistor and the capacitor Css2 form an LPF. Thus, a gate voltage of a transistor M3 is an analogous triangular wave 40 (in FIG. 4) with a frequency of Fmod, and a time constant of a rising edge or falling edge of the analogous triangular wave is $T=R*Css2=1/F*Css2/Css1.$ As F, Css1 and Css2 are all irrelevant to any factor in the power, voltage and temperature, the time constant is irrelevant to the power, voltage and temperature, and thus is not easily disturbed by the factors.

The transistor M3 converts the low-pass-filtered signal into a current signal, which is compared with a current of a third current source Iss3 to obtain a difference signal, and the difference signal is specifically a charge and discharge current with a frequency Fmod, that is, one portion of a complete cycle is a charge current, and the other portion is a discharge current. The loop filter circuit 32 modulates the difference signal onto a control voltage Vc.

In an example, the current of the third current source Iss3 has a value of I0, the currents of the first current source Iss1 and the second current source Iss2 having values of 2I0 and 0.5I0 respectively. Thus, the SSCG generates and outputs analogous triangular charge and discharge currents with a cycle of Fmod. Certainly, charge and discharge currents with an equal interval can also be generated at the drain of M3 by configuring the transistors M1, M2 and M3.

In operation, when the PLL starts, the output clock signal of the VCO 33 has not yet reached an expected frequency, a phase difference exists between the feedback clock signal and the reference clock signal, and thus an up signal or a dn signal may be generated. With the action of the up or dn signal, the CP 31 generates corresponding charge and discharge currents. At this time, the currents that charge and discharge the loop filter 32 are mainly from the CP 31. The loop filter 32 generates a voltage Vc after being charged and discharged, which is applied to an input end of the PLL 33, thereby adjusting an output frequency of the PLL 33.

When the feedback clock signal and the reference clock signal do not have a phase difference or have substantially the same phase, the up signal and the dn signal are narrowed or disappear, and thus Vcp is close to or equal to 0. At this time, the charge and discharge current acting on the loop filter circuit 32 is mainly a difference current, relevant to Iss1, Iss2 and Iss3, generated by the SSCG, and the difference current modulates the voltage Vc, and then modulates the frequency of the output clock signal of the PLL.

Figure 4:
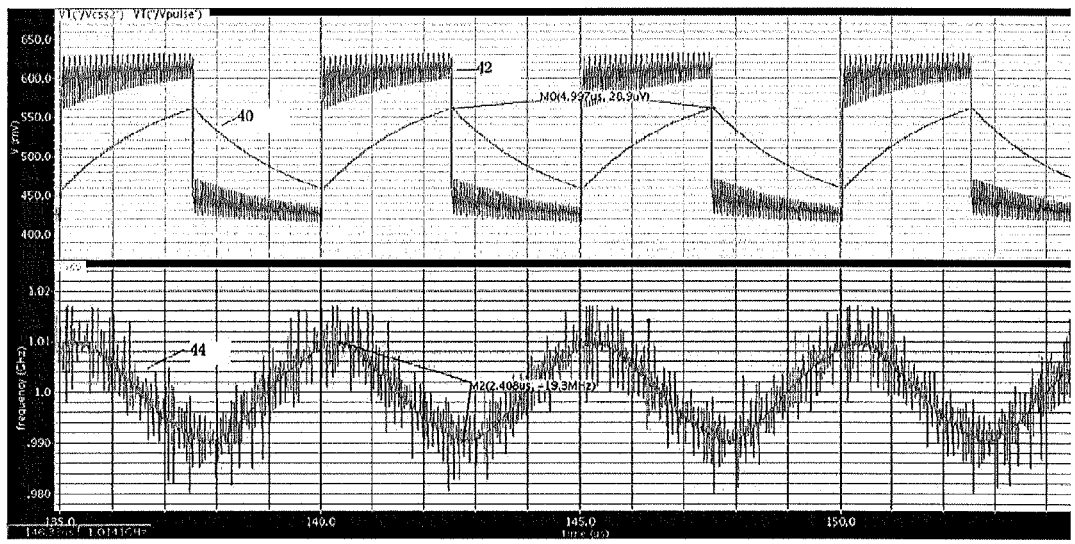
FIG. 4 illustrates various voltage and frequency waveform diagrams of a PLL.

FIG. 4 illustrates various voltage and frequency waveform diagrams of a PLL. A waveform 42, corresponding to a waveform before being input to the switched capacitor circuit, has a substantially square wave; this is a rectangular wave with a frequency of Fmod, having a high level of Iss1*$R_{M1}$, and a low level of Iss2*$R_{M2}$. A waveform 40 corresponds to a waveform after being processed by the switched capacitor circuit; the sign 44 illustrates the change situation of the frequency of the output signal of the VCO after modulation, and this frequency shows the change trend of an approximately triangular wave.

In an example, Ffb is 10 MHz; Fc may be equal to Ffb, or frequency division of Ffb, for example, 2 MHz. Fmod may be set as further frequency division of Fc, for example, 100 kHz. Thus, the spread spectrum effect of Fmod/Ffb (in this example, 1%) can be achieved.

Compared with the SS-PLL in the prior art, the SS-PLL in the embodiments of the present invention has a simple structure. The sole difference between the SS-PLL in the embodiments of the present invention and a non-SS-PLL lies in a switched capacitor circuit, in which the switched capacitor circuit controls a small portion of the CP current source. This ensures extremely low silicon overhead and low power consumption.

The SS-PLL in the embodiments of the present invention is flexible both in spreading factor and modulation frequency. Change of the capacitance ratio in the switched capacitor circuit will change the spreading factor. The modulation frequency can be adjusted by changing the switching frequency of the switched capacitor. Therefore, the SS-PLL in the embodiments of the present invention is particularly applicable to SOC applications and other embedded systems.

Figure 5:
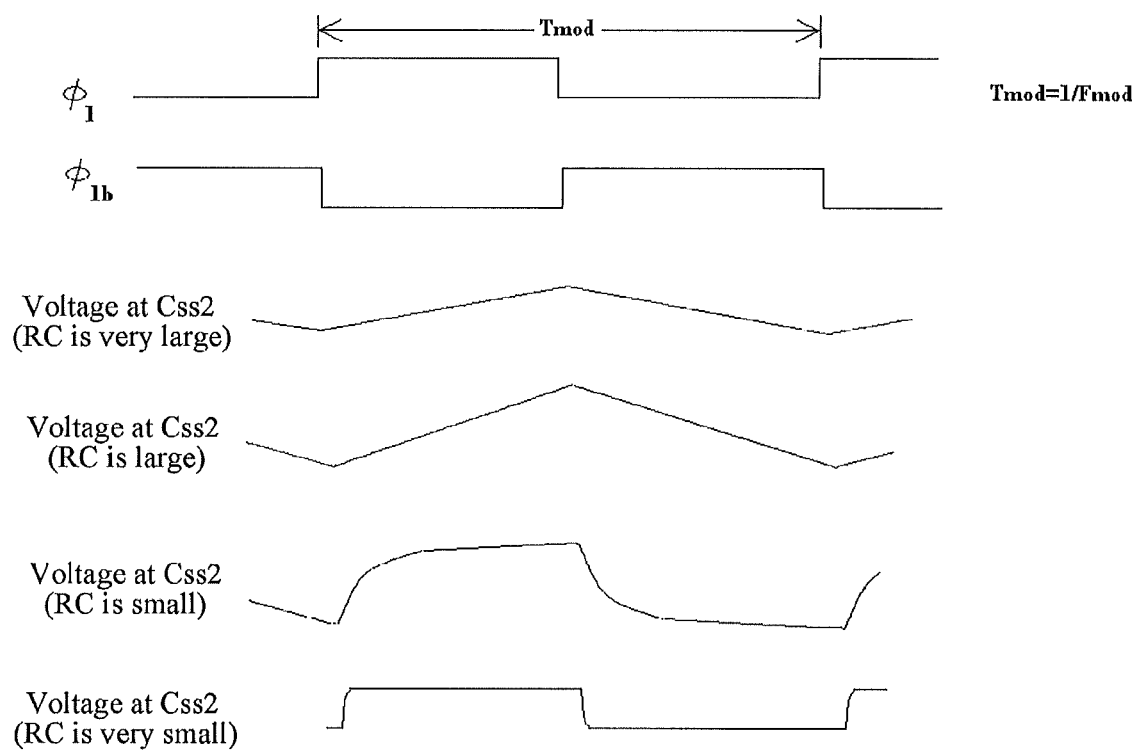
FIG. 5 is a schematic view of a relation between a spread spectrum and switched capacitor modulation.

The switched capacitor circuit also may implement different types of modulation waveforms, for example, trapezoid. In an example, the modulation waveform is changed by changing the capacitance ratio. FIG. 5 is a schematic view showing a relation between a spread spectrum and switched capacitor modulation. As shown in FIG. 5, waveforms of switches φ1 and φ1b are complementary to each other. The voltage appearing at the Css2 end changes with change of RC, in which R is a switched capacitor equivalent resistance, R=T/C, T is the switching frequency of the switched capacitor circuit, and C=Css1. When RC is large, the voltage at the Css2 end is close to a triangle; while the voltage at the Css2 end is close to a rectangle when RC is small.

Figure 6:
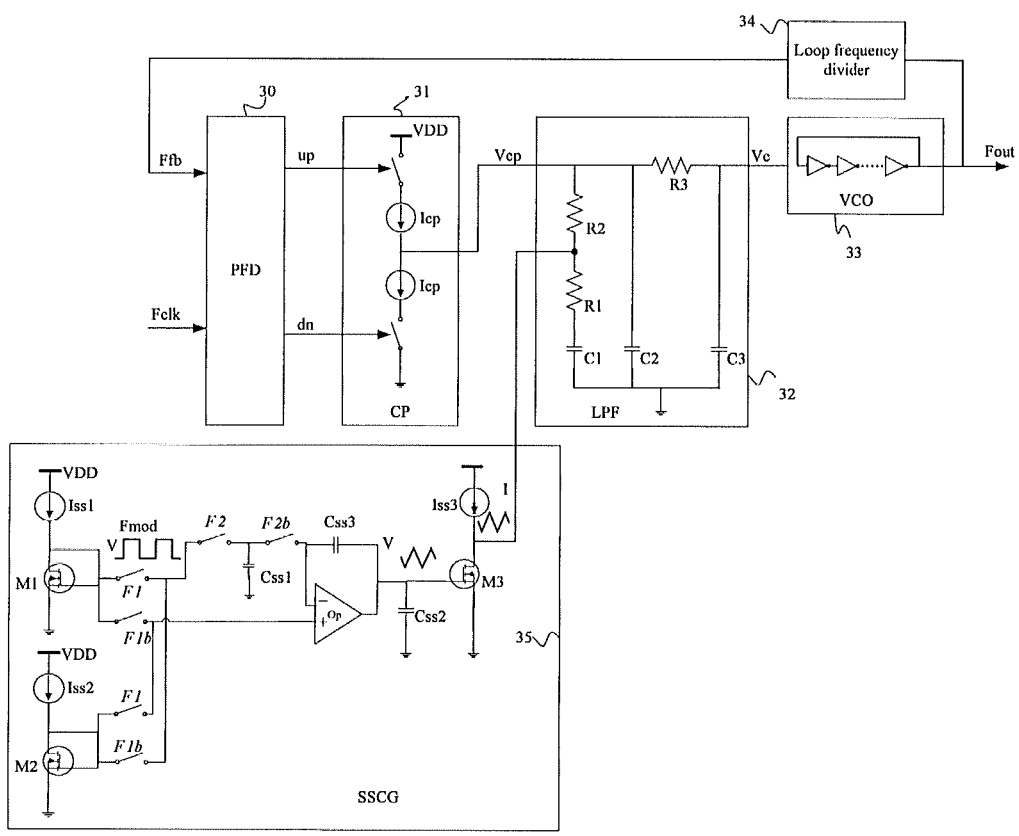
FIG. 6 illustrates an SS-PLL circuit according to another embodiment of the present invention.

FIG. 6 illustrates an SS-PLL circuit according to another embodiment of the present invention. FIG. 6 is different from FIG. 3 in replacing a switched capacitor filter in the switched capacitor circuit connected in series with an amplifier 0p. Specifically, a negative input end of the amplifier 0p is connected with a switched capacitor circuit. The switched capacitor filter alternately turns on and off the capacitor under the control of the signal φ2 with a switching frequency of fc, functioning as an LPF. The filter is equivalent to a resistor R with a resistance of 1/fcCss1, in which Css1 is the capacitance of the switched capacitor. A capacitor Css3 is connected between an output end and the negative input end of the amplifier 0p. Thus, the amplifier 0p functions as an integrator. The integration function of the integrator is represented by the following formula:

$$Vo(t) = -\frac{1}{RCss3}\int_{t0}^{t} Vi(t)\,dt + Vo(t0)$$

where Vo is the output of the integrator, Vi is the input voltage of the integrator at one side of the switched capacitor circuit, and R is the resistance of the switched capacitor circuit.

The currents Iss1 and Iss2 respectively pass through switches under the control of the complementary frequency pulses φ1 and φ1b, and then are respectively periodically and alternately gated and connected to the switched capacitor filter (then connected to the negative input end of the amplifier 0p) and a positive input end of the amplifier 0p. Specifically, when φ1 is active, the current Iss1 is coupled to the negative input end of the amplifier through the switched capacitor circuit, and the current Iss2 is coupled to the positive input end of the amplifier; when φ1b is active, the current Iss2 is coupled to the negative input end of the amplifier through the switched capacitor circuit, and the current Iss1 is coupled to the positive input end of the amplifier. Thus, the integrator respectively integrates a difference between voltages Iss1*$R_{M1}$ and Iss2*$R_{M2}$ and a difference between voltages Iss2*$R_{M2}$ and Iss1*$R_{M1}$ in different periods of time.

The transistor M3 converts the integrated signal into a current signal, which is compared with the current of the third current source Iss3 to obtain a difference signal. The loop filter 32 modulates the signal onto the control voltage Vc.

The SS-PLL circuit in FIG. 6 also ensures extremely low silicon overhead and low power consumption. In addition, change of the capacitance ratio in the switched capacitor circuit will change the spreading factor. The modulation frequency can be adjusted by changing the switching frequency of the switched capacitor.

In this embodiment, a direct current point of the gate of the transistor M3 is decided by an output direct current level of the amplifier, and thus the control over the transistor M3 is more flexible.

Additionally, the resistance R can be changed by changing the frequency of φ2, and then the bandwidth of the integrator is changed, so as to perform control better.

The objectives, technical solutions, and beneficial effects of the present invention have been described in further detail through the above specific embodiments. It should be understood that the above descriptions are merely specific embodiments of the present invention, but not intended to limit the protection scope of the present invention. Any modification, equivalent replacement, or improvement made within the spirit and principle of the present invention should fall within the protection scope of the present invention.

What is claimed is:

1. A spread spectrum phase locked loop (PLL) circuit, comprising:
a spread spectrum clock generator (SSCG) including a switched capacitor circuit located in the SSCG, a first current source and a second current source,
wherein the SSCG is configured to periodically and alternately select signals corresponding to the first current source and the second current source, respectively, with a frequency lower than a feedback clock signal,
the switched capacitor circuit is configured to perform low pass filtering on the selected signals to generate a modulation waveform,
wherein an output of the spread spectrum phase locked loop (PLL) circuit is modulated.

2. A spread spectrum phase locked loop (PLL) circuit, comprising:
a spread spectrum clock generator (SSCG) including a switched capacitor circuit located in the SSCG, the SSCG further has a first current source, a second current source, a capacitor, and an amplifier,
wherein the second current source, the amplifier and the capacitor are connected to form an integrator;
the SSCG is configured to periodically and alternately select corresponding to the first current source and the second current source, respectively, with a frequency lower than a feedback clock signal, to be used as positive and negative input signals of the integrator; and
an output signal of the integrator has a modulation waveform.

3. A spread spectrum phase locked loop (PLL) circuit, comprising:
a spread spectrum clock generator (SSCG) including a switched capacitor circuit, wherein the switched capacitor circuit generates a modulation waveform, and the modulation waveform is injected into the PLL circuit in a current form, so that a PLL output frequency is modulated;
wherein the SSCG further comprises a current source, and the SSCG is configured to compare the modulation waveform with a current of the third current source to obtain a difference signal, and
the loop filter circuit modulates the difference signal to a control voltage.

4. The spread spectrum PLL circuit according to claim 3, wherein the SSCG further comprises a transistor having a gate for receiving the filtered signals, and having a drain for receiving the current of the third current source.

5. The spread spectrum PLL circuit according to claim 1, wherein the modulation waveform is a triangular wave.

6. The spread spectrum PLL circuit according to claim 1, further comprising:
a charge pump circuit (CP) for switching release and inhalation of charge and discharge currents according to a phase difference between a feedback clock signal of an output clock signal of the PLL circuit and a reference clock signal;
a loop filter circuit (LPF), having a filter capacitor, wherein the filter capacitor is charged and discharged by the charge and discharge currents and generates a control voltage; and
a voltage controlled oscillator (VCO), for oscillating with a frequency corresponding to the control voltage.

7. A spectrum spreading method of a phase locked loop (PLL) circuit, comprising:
generating a modulation waveform with the switched capacitor circuit according to claim 2; and injecting the modulation waveform into the PLL circuit according to claim 3 in a current form so that a PLL output frequency is modulated.

* * * * *